(12) United States Patent
Hu et al.

(10) Patent No.: US 10,121,520 B2
(45) Date of Patent: Nov. 6, 2018

(54) MEMORY ARRAY AND METHOD OF FORMING THE SAME

(71) Applicant: TAIWAN SEMICONDUCTOR MANUFACTURING COMPANY, LTD., Hsinchu (TW)

(72) Inventors: Yu-Hao Hu, Kaohsiung (TW); Yi-Tzu Chen, Hsinchu (TW); Hao-I Yang, Hsinchu (TW); Cheng-Jen Chang, Taoyuan (TW); Geng-Cing Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/960,815

(22) Filed: Apr. 24, 2018

(65) Prior Publication Data
US 2018/0240505 A1   Aug. 23, 2018

Related U.S. Application Data

(60) Continuation of application No. 15/443,418, filed on Feb. 27, 2017, now Pat. No. 9,959,911, which is a
(Continued)

(51) Int. Cl.
| | |
|---|---|
| *G11C 5/14* | (2006.01) |
| *G11C 7/06* | (2006.01) |
| *G11C 7/12* | (2006.01) |
| *H01L 21/768* | (2006.01) |
| *H01L 23/522* | (2006.01) |
| *H01L 23/528* | (2006.01) |
| *H01L 27/105* | (2006.01) |

(52) U.S. Cl.
CPC ............ *G11C 5/144* (2013.01); *G11C 7/062* (2013.01); *G11C 7/12* (2013.01); *H01L 21/76816* (2013.01); *H01L 21/76877* (2013.01); *H01L 23/528* (2013.01); *H01L 23/5226* (2013.01); *H01L 27/1052* (2013.01)

(58) Field of Classification Search
CPC ...... G11C 5/147; G11C 5/145; G11C 11/4074
USPC .............. 365/189.02, 207, 230.05, 190
See application file for complete search history.

(56) References Cited

U.S. PATENT DOCUMENTS

| | | | | |
|---|---|---|---|---|
| 5,276,650 | A * | 1/1994 | Kubota | G11C 7/18 365/189.02 |
| 2014/0211553 | A1* | 7/2014 | Lai | G11C 29/025 365/163 |

(Continued)

*Primary Examiner* — Jason Lappas
(74) *Attorney, Agent, or Firm* — Hauptman Ham, LLP

(57) ABSTRACT

A memory array includes a first column of memory cells, a second column of memory cells, a first pre-charge circuit, a second pre-charge circuit and a set of input output circuits. The first column of memory cells includes a first bit line, a first word line and a first bit line bar. The second column of memory cells includes the first bit line bar, a second word line and a second bit line. The first pre-charge circuit is coupled to the first bit line. The second pre-charge circuit is coupled to the first bit line bar. The first column of memory cells and the second column of memory cells are configured to share the first bit line bar. The first bit line and the first bit line bar are in a first plane. At least a portion of the first word line and at least a portion of the second word line are in a second plane intersecting the first plane.

20 Claims, 9 Drawing Sheets

Related U.S. Application Data division of application No. 14/060,742, filed on Oct. 23, 2013, now Pat. No. 9,583,494.

(56) References Cited

U.S. PATENT DOCUMENTS

| | | | |
|---|---|---|---|
| 2014/0313813 A1* | 10/2014 | Sonehara | G11C 13/0026 |
| | | | 365/148 |
| 2015/0055402 A1* | 2/2015 | Chen | G11C 7/12 |
| | | | 365/156 |

* cited by examiner

MEMORY ARRAY AND METHOD OF FORMING THE SAME

PRIORITY CLAIM

The present application is a continuation of U.S. application Ser. No. 15/443,418, filed Feb. 27, 2017, now U.S. Pat. 9,959,911, issued May 1, 2018, which is a divisional of U.S. application Ser. No. 14/060,742, filed Oct. 23, 2013, now U.S. Pat. No. 9,583,494, issued Feb. 28, 2017, which are incorporated herein by reference in their entireties.

BACKGROUND

Device manufacturers are continually challenged to reduce the size of various integrated circuits and semiconductor devices while increasing processing speeds and reducing power consumption.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
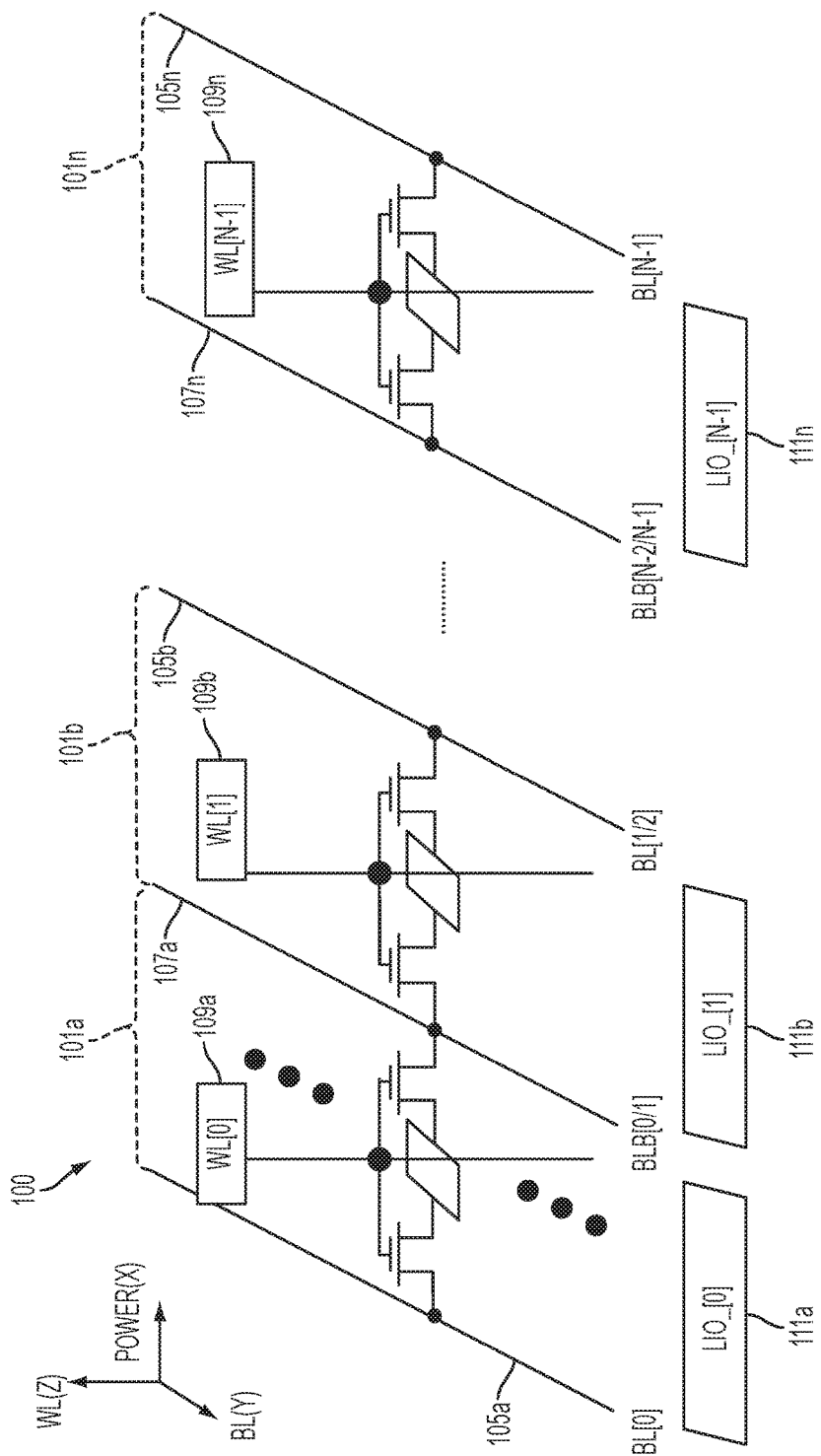
FIG. 1 is a diagram of a memory array, in accordance with one or more example embodiments.

The following disclosure provides many different embodiments, or examples, for implementing different features of the invention. Specific examples of components and arrangements are described below to simplify the present disclosure. These are examples and are not intended to be limiting.

Device manufacturers are continually challenged to reduce the size of various integrated circuits and semiconductor devices such as, for example, memory arrays despite the overarching demand to increase processing speeds while reducing power consumption of such devices.

Some memory arrays include a two-dimensional structure in which a plurality of neighboring memory columns individually include bit line and bit line bar pairs in communication with one or more word lines that span the plurality of memory columns. In other words, there are two times the number of bit lines and bit line bars as there are memory columns in a two-dimensional memory array that have one or more word lines spanning a plurality of memory columns.

Some two-dimensional structures also include a spacing compliant with particular design rules, e.g., Design Rule Check ("DRC") spacing, between the plurality of memory columns to ensure that the memory columns work properly. Such spacing increases the overall peripheral or layout size of a memory array as more and more memory columns are included. The spacing between memory columns in these two-dimensional structures also reduces speed capabilities of a particular memory array because of, for example, the distance between the memory columns.

Bit lines are often associated with bit line switches that facilitate a bit line to be any of Read-selected/Write-selected/Not-selected. There are often two times the number of bit line switches as there are memory columns in two-dimensional memory arrays. Such bit line switches increase power consumption and reduce processing speeds. Additionally, the inclusion of peripheral circuits such as bit line switches, numerous word lines that span the plurality of memory columns, numerous local input/output ("LIO") pre-charge P-type metal-oxide semiconductor ("PMOS") circuits, LIO Y-pass-gate (read/write) metal-oxide semiconductor ("MOS") circuits, and the like result in a peripheral area of a memory array that is greater than a minimum possible peripheral area that might otherwise be achievable but for the presence of such peripheral circuitry.

For example, some two-dimensional memory arrays include a number of LIO Pre-charge-PMOS and Read/Write-pass-gate circuits associated with each bit line and bit line bar pair that spans across the two-dimensional memory array equal to two times the number of memory columns included in the two-dimensional memory array. Similarly, there are two times the number of LIO Y-pass-gate (Read/Write-pass-gate) MOS circuits as there are LIO's.

Two-dimensional memory arrays are not readily adaptable to share or merge a bit line and a neighboring bit line bar to eliminate the spacing between memory columns. The spacing cannot be eliminated because the neighboring memory columns will conflict with one another when a word line is activated. The parasitic coupling capacitance between two active bit-lines creates undesirable signal noise, reduces processing speed capabilities and increases power consumption.

FIG. 1 is a diagram of a memory array 100 according to one or more example embodiments. The memory array 100 has a shared bit line structure for a MUX N (Bit-interleave N) application. In some embodiments, the memory array 100 is configured to provide a memory circuit that occupies a minimal amount of spacing, whether such spacing is in a peripheral sense (e.g. two-dimensional occupied space) or overall three-dimensional spacing. In some embodiments, the memory array 100 also increases processing speeds and reduces power consumption when compared to some two-dimensional memory arrays.

The memory array 100 includes N memory columns 101a-101n (hereinafter collectively referred to as memory column(s) 101 where appropriate).

The memory array 100 also includes a series of bit lines ("BL") 105a-105n (hereinafter collectively referred to as BL 105 where appropriate) and bit line bars ("BLB") 107a-107n (hereinafter collectively referred to as BLB 107 where appropriate). In some embodiments, the sequence of BL's and BLB's as illustrated are readily swapped to change the order of BL's with respect to BLB's while maintaining the alternating sequence of BL's to BLB's. Accordingly, when referring generally to a "bit line" such reference refers to either a BL or a BLB depending on the embodiment. As such, in some embodiments, the memory array 100 includes N+1 bit lines.

The memory array 100 additionally includes N word lines ("WL") 109a-109n (hereinafter collectively referred to as WL 109 where appropriate). The memory array 100 further includes local input/outputs ("LIO") 111a-111n (hereinafter collectively referred to as LIO 111 where appropriate).

Memory column 101a is associated with BL 105a, bit line bar ("BLB") BLB 107a, WL 109a, and LIO 111a. Memory column 101b is associated with the BLB 107a, BL 105b, WL 109b, and LIO 111b. Memory column 101n is associated with BLB 107n, BL 105n, WL 109n, and LIO 111n. The memory array 100, in other words, includes any quantity of memory columns 101, bit lines 105, bit lines bars 107, word lines 109 and LIO's 111 such that the population of memory columns 101=N, bit lines 105/107=N+1, and word lines 109=N. The number of LIO's 111 included in the memory array 100 is any quantity of LIO's 111. In some embodiments, the memory array 100 includes N LIO's 111, N+1 LIO's 111, etc.

In some embodiments, the memory column 101a and memory column 101b are adjacent. Memory column 101a and memory column 101b share BLB 107a, for example, based on a switching between a logic pass [0] and a logic pass [1]. Sharing BLB 107a between logic passes [0/1] makes it possible to eliminate spacing between the memory column 101a and memory column 101b, thereby reducing the size of the memory array 100 toward a minimum overall size and increasing processing speeds when compared to some two-dimensional memory arrays having significant spacing. Additionally, sharing BLB 107a between memory column 101a and memory column 101b makes it possible to reduce the quantity of "bit line switches," or LIO per-charge PMOS circuits, included in a memory array, such as memory array 100, thereby conserving space. Because there are fewer bit line switches in the memory array, in some embodiments, power consumption is reduced compared to some two-dimensional memory array structures having more bit line switches.

In some embodiments, WL's 109 are configured to be formed such that the WL's 109 are substantially orthogonal to the BL's 105 and BLB's 107. For example, in some embodiments, BL's 105 and BLB's 107 are in a same plane. WL's 109, accordingly, are substantially orthogonal to the plane that includes the BL's 105 and the BLB's 107. In some embodiments, WL's 109 are part of a continuous inter-leaved WL 109 that winds through memory columns 101 in a manner that facilitates sharing bit lines such as portions of the continuous inter-leaved WL 109 being substantially orthogonal to the BL's 105 and BLB's 107.

In some embodiments, the memory columns 101 are associated with WL's 109 to facilitate sharing neighboring BL's 105 and/or BLB's 107. Bit-interleaving such as the discussed sharing of BL's 105 and/or BLB's 107 paired with having WL's 109 that are associated with memory columns 101 in the manner described eliminates the coupling effect discussed above. In some embodiments, the bit line sharing makes it possible to reduce power consumption and/or increase processing speed capabilities of the memory array 100.

In some embodiments, the memory array 100, BL's 105, BLB's 107, WL's 109, and LIO's 111 comprise one or more conductive materials implanted or otherwise formed as one or more layers in or on a semiconductor substrate so that the conductive materials or layers are routed for the corresponding line or LIO, for example. In other embodiments, the memory array 100, BL's 105, BLB's 107, WL's 109, and LIO's 111 comprise individual modules assembled on one or more semiconductor substrates.

For ease of understanding, some of the figures include an XYZ axis to generally illustrate the directional relationships described regarding one or more example embodiments.

Figure 2:
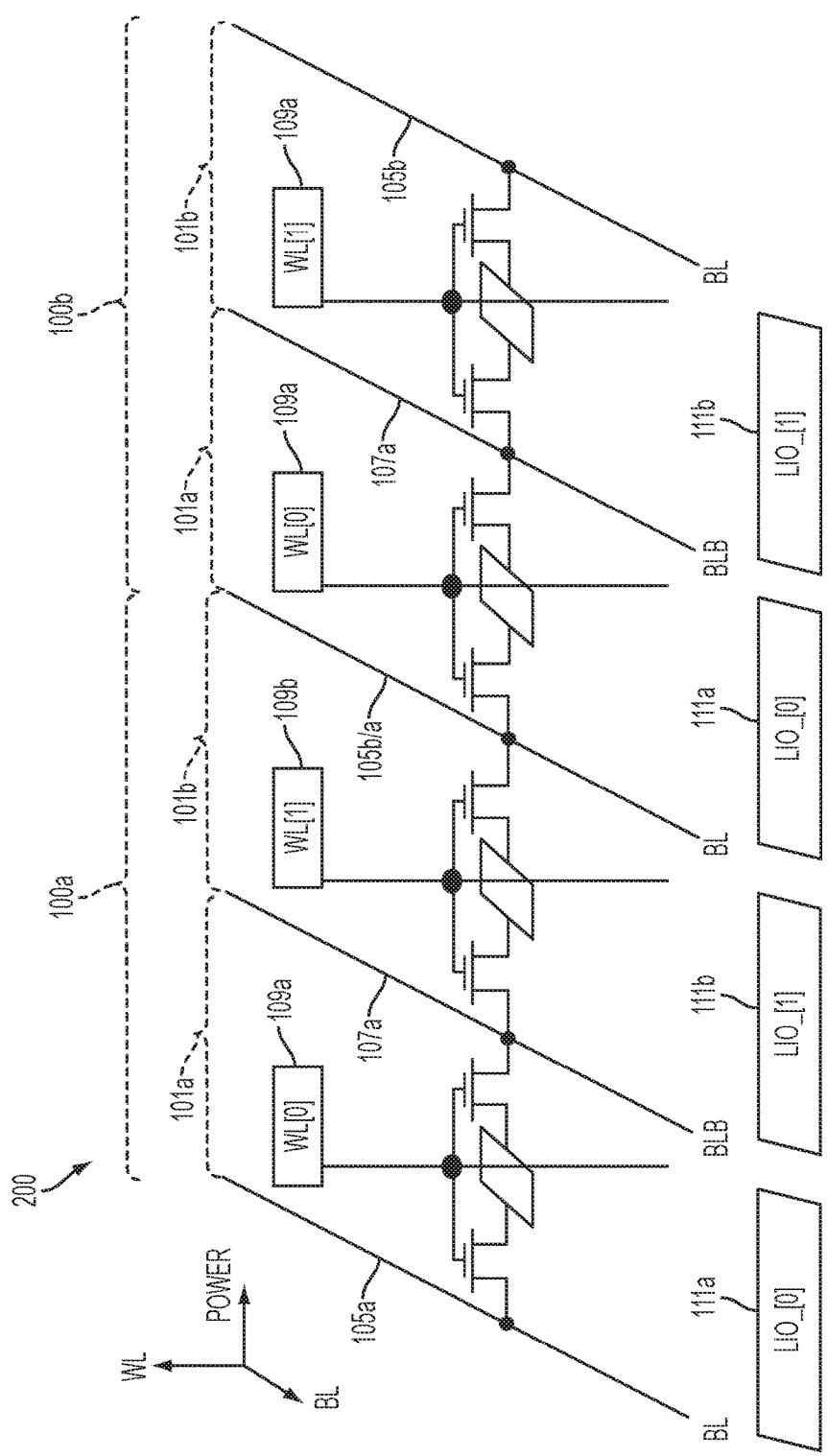
FIG. 2 is a diagram of the memory array configured to illustrate bit line sharing for a MUX 2 (Bit-interleave-2) structure, in accordance with one or more example embodiments.

FIG. 2 is a diagram of the memory array 200 configured to illustrate a shared BL for a MUX 2 N (Bit-interleave-2) structure, according to one or more example embodiments. In some embodiments, a shared BL is also applicable when joining separate memory arrays such as multiple memory arrays 100, discussed above. In this example, the memory array 200 is configured to have two memory arrays 100 that each have two memory columns 101 (i.e., N=2). As such, the memory array 200 includes a first memory array 100a similar to memory array 100 discussed above and a second memory array 100b also similar to memory array 100 discussed above.

Memory array 200 is configured such that memory array 100a and memory array 100b share BL 105b/a that is illustrated to be the end BL for memory array 100a and the end BL for memory array 100b.

Figure 3:
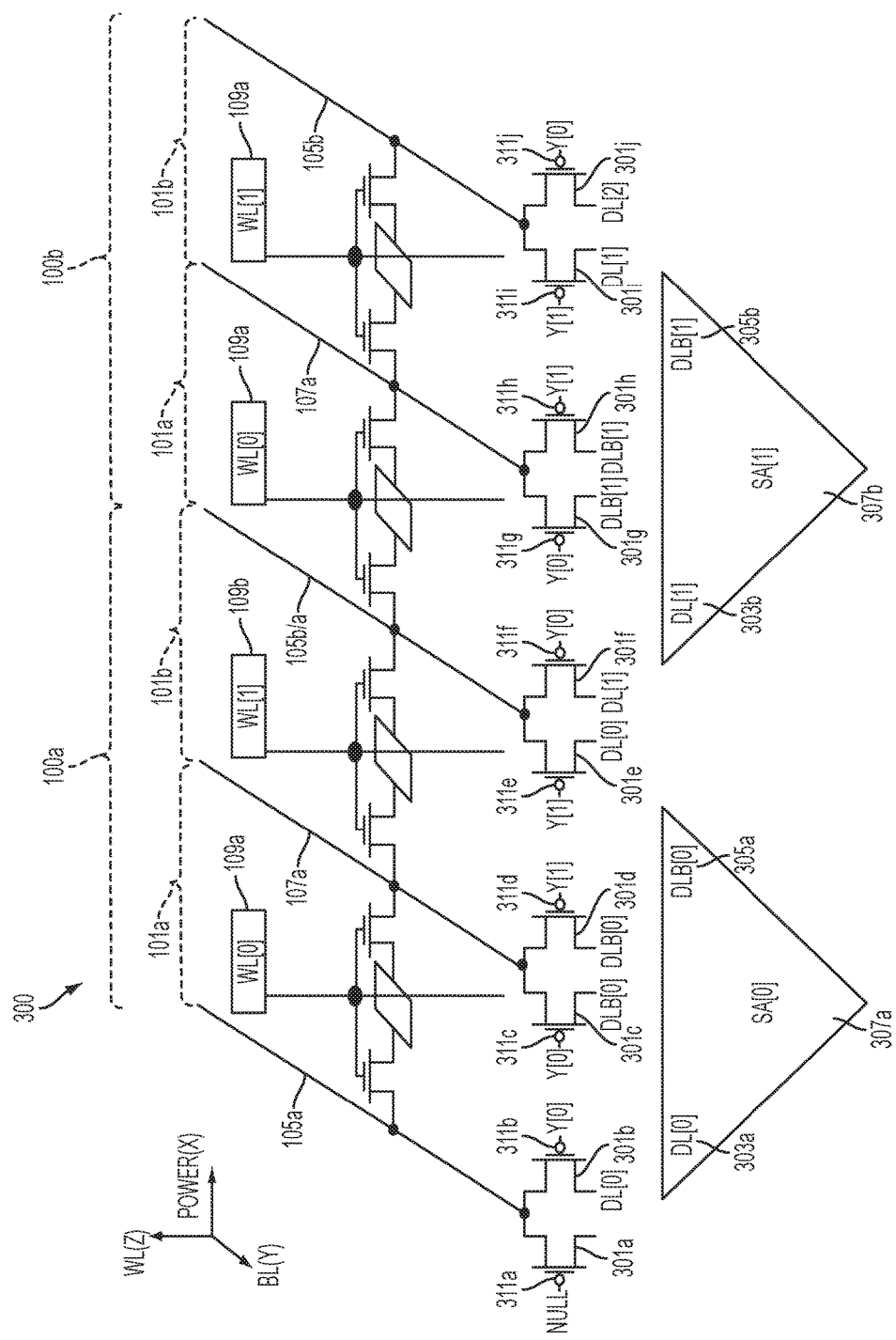
FIG. 3 is a diagram of a memory array configured to illustrate a boundary example of a YMUX 2 application of a shared bit line structure, in accordance with one or more example embodiments.

FIG. 3 is a diagram of a memory array 300 configured to illustrate a boundary example of a YMUX 2 application of a shared bit line structure, such as those discussed above, according to an example embodiment. In this example, the memory array 300 is configured similarly to memory array 200 discussed above to have two memory arrays 100 that have two memory columns 101. Accordingly, memory array 300, like memory array 200, is an example of a combination of two N=2 memory column structures. The BL's 105 and BLB's 107 are associated with BL switches 301a-301j (hereinafter collectively referred to as BL switch 301 where appropriate) within memory arrays 100a and 100b.

Memory array 300 is in communication with data line ("DL") 303a, DL 303b, data line bar ("DLB") 305a and DLB 305b. DL 303a and DLB 305a are associated with a sense amplifier ("SA") 307a. DL 303b and DLB 305b are associated with a SA 307b. BL switch 301a is null. BL switch 301b is in communication with DL 303a, BL switch 301c is in communication with DLB 305a, BL switch 301d is in communication with DLB 305a, BL switch 301e is in communication with DL 303a, BL switch 301f is in communication with DL 303b, BL switch 301g is in communication with DLB 305b, BL switch 301h is in communication with DLB 305b, BL switch 301i is in communication with DL 303b and BL switch 301j is in communication with another DL [not shown]. BL switch 301j, for example, is associated with another memory column or memory array (not shown) or part of a BL switch pair at the boundary of memory array 300.

In this example embodiment, BL switch 301a is null and BL switch 301j is in communication with another DL. As such, each of the memory arrays 100a and 100b have 2*N BL switches 301 (i.e., memory array 100a has four BL switches 301 and memory array 100b has four BL switches 301). The memory array 300, therefore, includes eight BL switches 301 in communication with two SA's 307.

Such arrangement, as discussed above, results in a space occupied by the memory array 300 to be driven toward a minimum, power consumption to be driven toward a minimum and processing speed capabilities of the memory array 300 to be driven toward a maximum while still accommodating a minimal amount circuitry to achieve the example embodiment. In addition to reduced space occupancy, power consumption and increased processing speeds, the reduction in features compared to some two-dimensional memory array structures also reduces the overall complexity of the memory array 300 thereby improving reliability and/or manufacturability as well.

According to this example embodiment, memory array 300 is also in communication with Y-directional decoder output ("YDEC") signals 311a-311j (hereinafter collectively referred to as YDEC signal 311). YDEC signals 311 are associated with one of a logic pass [0] and a logic pass [1]. The number of YDEC signals 311 for logic pass [0] is N YDEC signals 311. The number of YDEC signals 311 for logic pass [1] is N YDEC signals 311. In total, there is an equivalent number of YDEC signals 311 to the number of BL switches 301, or 2*N YDEC signals 311. In some embodiments, the total gate loading of all YDEC-signals is 2N*(Number of SA/IO).

Figure 4:
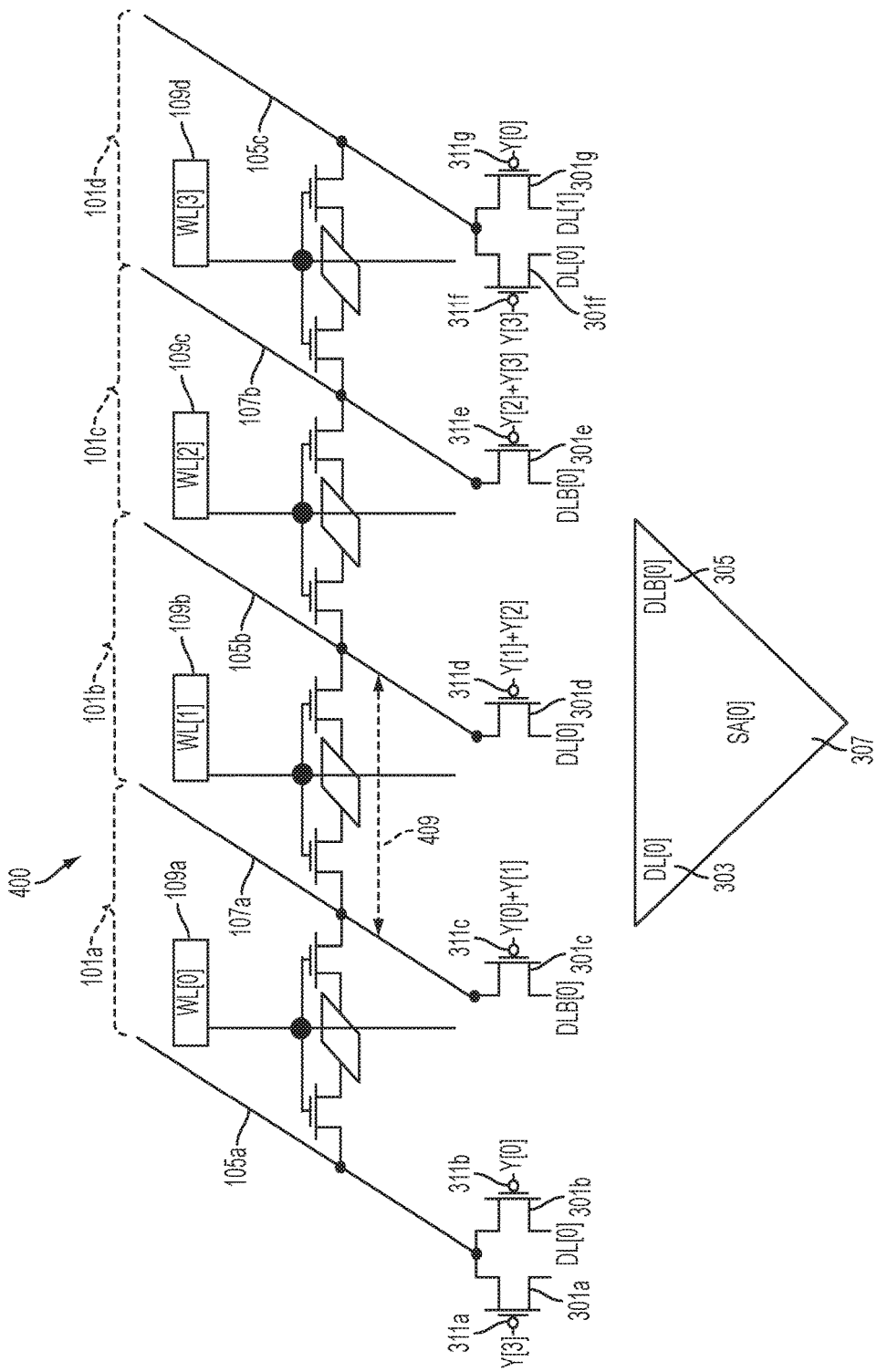
FIG. 4 is a diagram of a memory array configured to illustrate bit line sharing for a YDEC design for MUX 4 application, which has a shared Read-Pass-Gate, in accordance with one or more example embodiments.

FIG. 4 is a diagram of a memory array 400 configured to illustrate the discussed bit line sharing for a YDEC design for MUX 4, according to an example embodiment. In this example, the memory array 400 is configured similarly to memory array 100 for an N=4 memory column structure. Accordingly, memory array 400 has N=4 memory columns 101 and N=4 WL's 109. The BL's 105 and BLB's 107 are associated with BL switches 301a-301g totaling N+1 bit lines.

Memory array 400 is in communication with DL 303, DLB 305. DL 303 and DLB 305 are associated with a SA 307. BL switch 301a is null. BL switch 301b is in communication with DL 303, BL switch 301c is in communication with DLB 305, BL switch 301d is in communication with DL 303, BL switch 301e is in communication with DLB 305, BL switch 301f is in communication with DL 303, and BL switch 301g is in communication another DL [not shown]. BL switch 301g, for example, is associated with another memory column or memory array [not shown], or is formed as part of a BL switch pair at the boundary of the memory array 400.

In this example embodiment, BL switch 301a is null and BL switch 301g is in communication with another DL. As such, the memory array 400 has N+1 BL switches 301. The memory array 400, therefore, includes five BL switches 301 in communication with one SA 307.

Memory array 400 has a column pitch 409 (i.e. a spacing between memory column 101a and memory column 101c that is equal to the width of memory column 101b between them). In other words, there is no additional metal spacing regulated by DRC between neighboring memory columns 101. Such arrangement, as discussed above, results in a space occupied by the memory array 400 to be driven toward a minimum, while increasing processing speed capabilities of the memory array 400 toward a maximum. Further, because certain BL's 105 and BLB's 107 are configured to share some of the BL switches 301, BL switch 301 or pre-charge power consumption is reduced toward a minimum power consumption. Such accomplishments are done while still accommodating a minimal amount circuitry to achieve the example embodiment.

According to this example embodiment, memory array 400 is also in communication with YDEC signals 311a-311g. There is an equivalent number of YDEC signals 311 to the number of BL switches 301. In other words, there are N+1 YDEC signals 311 and N+1 switches per LIO in a mux-N design (i.e. five YDEC signals 311b-311f for a MUX-4 design). The YDEC signals 311 are increased to be N+1, (i.e., logic passes [0], [0]+[1], [1]+[2], [2]+[3], and [3]) but actually are reduced in overall wire loading (N+1)* (number of SA/IO) compared to the memory array 300 discussed above and compared to some two-dimensional memory arrays. Accordingly, the overall reduction in YDEC signals 311 compared to memory array 300 and to some two-dimensional memory arrays not only reduces space occupied by the memory array 400, reduces power consumed by the memory array 400 and increases processing speed capabilities of the memory array 400, but also reduces the number of features included in the memory array 400 toward a minimum, thereby reducing the overall complexity of the memory array 400 and improving reliability and manufacturability as well.

Figure 5:
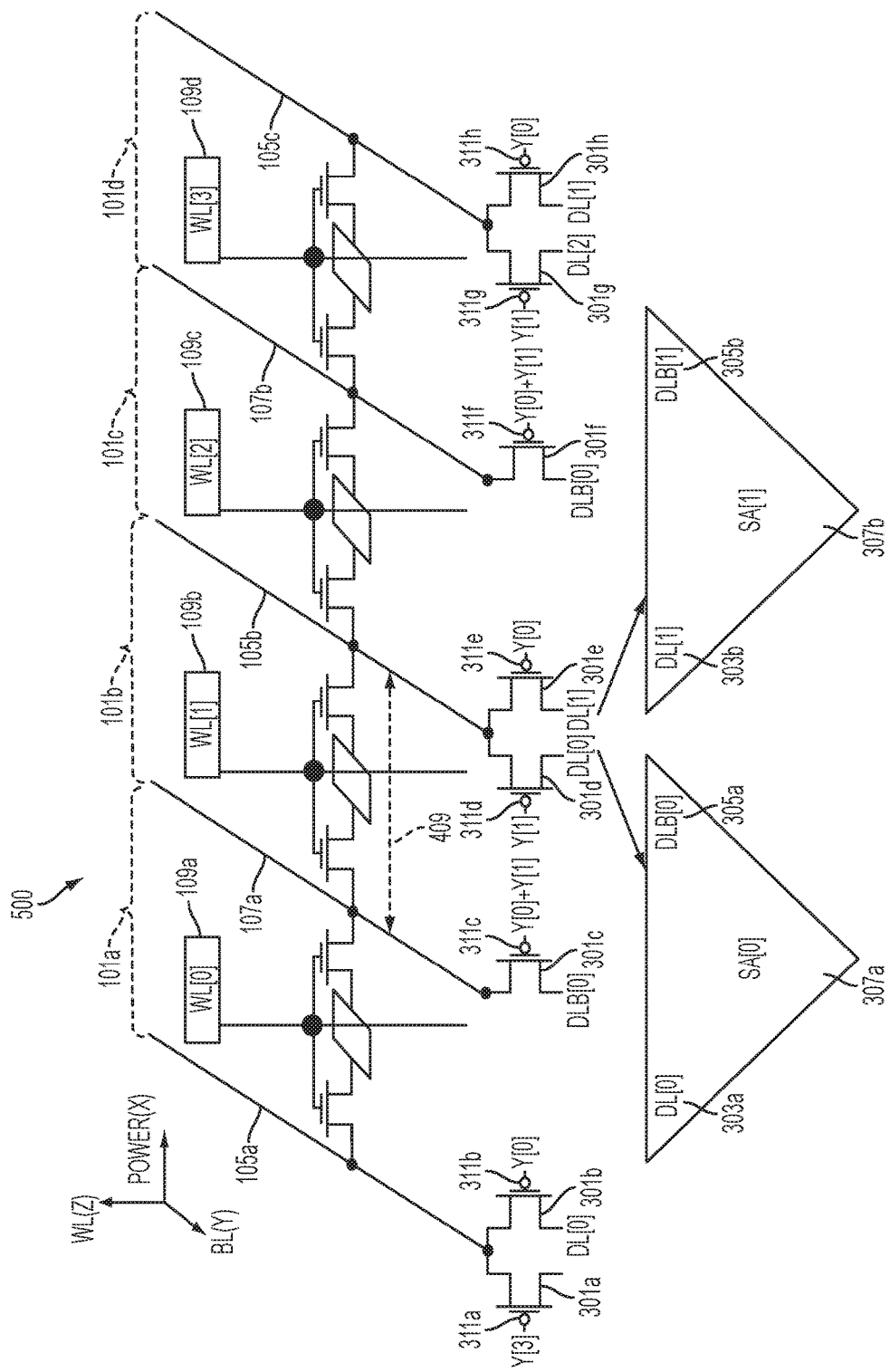
FIG. 5 is a diagram of a memory array configured to illustrate bit line sharing for a YDEC design for MUX 2 application, which has a shared Read-Pass-Gate, in accordance with one or more example embodiments.

FIG. 5 is a diagram of a memory array 500 configured to illustrate the discussed bit line sharing for a YDEC design for MUX 2, according to an example embodiment. In this example, the memory array 400 is configured similarly to memory array 100 for an N=4 memory column structure. Accordingly, memory array 400 has four memory columns 101. The memory array 500 is similar to the memory array 400, discussed above, but is configured to accommodate two SA's 307 like memory array 300 discussed above with respect to FIG. 3. BL's 105 and BLB's 107 are associated with BL switches 301a-301h to accommodate the communication with SA 307a and SA 307b.

Memory array 500 is in communication with DL 303a, DL 303b, DLB 305a and DLB 305b. DL 303a and DLB 305a are associated with SA 307a. DL 303b and DLB 305b are associated with a SA 307b. BL switch 301a is null. BL switch 301b is in communication with DL 303a, BL switch 301c is in communication with DLB 305a, BL switch 301d is in communication with DL 303a, BL switch 301e is in communication with DL 303b, BL switch 301f is in communication with DLB 305a, BL switch 301g is in communication with DL 303a, BL switch 301h is in communication with DL 303b.

In this MUX 2 example embodiment, BL switch 301a is null and BL switch 311h is in communication with DL[2] 303 (not shown). Accordingly, to accommodate SA 307a and SA 307b with a minimal number of BL switches, the memory array 500 includes 2+1 BL switches 301 or N+1 BL switches 301 per LIO (per SA 307).

The memory array 500 has a column pitch 409 (i.e., a spacing between memory column 101a and memory column 101c that is equal to the width of memory column 101b between them). In other words, there is no additional metal spacing regulated by DRC between neighboring memory columns 101. Such an arrangement, as discussed above, results in a space occupied by the memory array 500 to be driven toward a minimum and processing speed capabilities of the memory array 500 to be driven toward a maximum while still accommodating a minimal circuitry to achieve the example embodiment.

According to this example embodiment, memory array 500 is also in communication with YDEC signals. The number of YDEC-signals is 2+1 (i.e., [0], [0]+[1], and [1]). The total gate-loading of YDEC-signal=(2+1)*(number of SA/IO), or N=2. Accordingly, the overall reduction in YDEC signals 311 compared to memory array 300, and to some two-dimensional memory array, not only reduces space occupied by the memory array 500, reduces power consumed by the memory array 500 and increases processing speed capabilities of the memory array 500, but also reduces the number of features included in the memory array 500 toward a minimum, thereby reducing the overall complexity of the memory array 500 and improving reliability and manufacturability as well.

Figure 6:
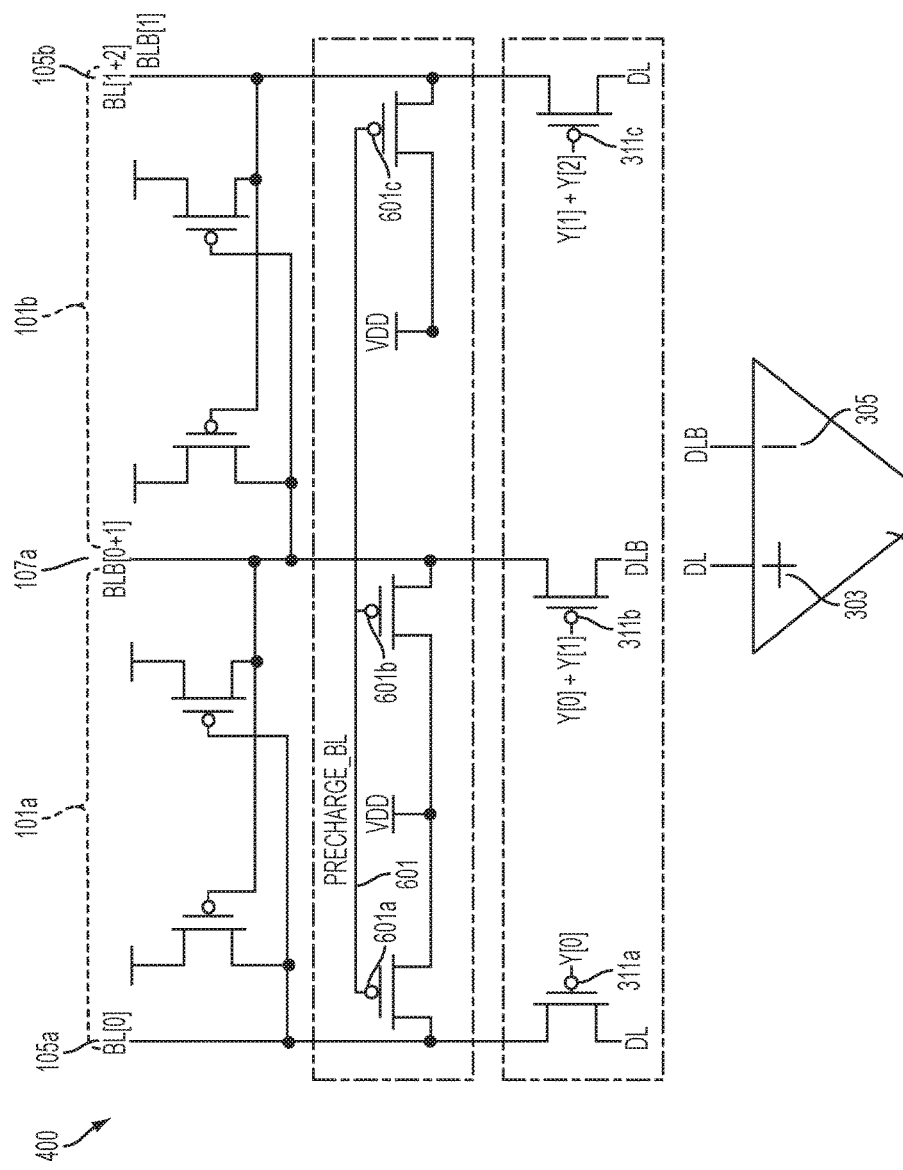
FIG. 6 is a close-up view of a portion of the memory array illustrated in FIG. 4, in accordance with one or more example embodiments.

FIG. 6 is a close-up view of a portion of memory array 400, discussed above. The illustrated portion of memory array 400 demonstrates a shared BL pre-charge and YDEC READ, according to an example embodiment.

A BL pre-charge line, in this example, has three BL pre-charge nodes, 601*a*, 601*b* and 601*c* (hereinafter collectively referred to as BL pre-charge node 601 where appropriate). The BL pre-charge nodes 601 are configured to receive a signal from a processor or controller such as memory controller 805, discussed below, to provide pre-charge power to the memory array 400. In this example, there are three BL pre-charge nodes 601, or in other words N+1 BL pre-charge nodes 601. In this example, BLB 107*a* is shared between memory column 101*a* and memory column 101*b*, and BL pre-charge node 601*b* is shared between memory columns 101*a* and 101*b*, for example. Similarly, with BL 105*b* is one of shared with a next memory column 101, such as memory column 101*c* discussed above, or not shared with any next memory column 101 if BL 105*b* is at the boundary of a memory array, for example. BL pre-charge node 601*c*, accordingly, depending on embodiment, is shared to pre-charge BL 105*b*, for example.

This sharing of pre-charge nodes 601 reduces power consumption by the memory array 400 during pre-charge of the BL's 105 and BLB's 107, as well as space consumed by the memory array 400 compared to a two-dimensional memory array that includes BL-pre-charge nodes having an equal quantity to the quantity of BL's and BLB's included in the two-dimensional memory array.

YDEC's 311*a*, 311*b* and 311*c* are associated with BL 105*a*, BLB 107*a* and BL 105*b*. In this example, there are three YDEC's 311, or in other words N+1 YDEC's 311. With BLB 107*a* being shared between memory column 101*a* and memory column 101*b*, YDEC 311*b* is also shared. Similarly, with BL 105*b* being shared in memory array 400, YDEC 311*c* is also shared. In some embodiments, such as those in which a memory array does not have a next memory column 101, the YDEC 311*c*, or any other YDEC at the boundary of such a memory column, is not shared.

This sharing of YDEC's 311 reduces power consumption, increases processing speed capabilities, reduces space occupied by the memory array 400 and reduces the complexity of the memory array 400 compared to a two-dimensional memory array that includes YDEC's populated to a quantity equal to a quantity of BL's and BLB's included in the two-dimensional memory array.

Figure 7:
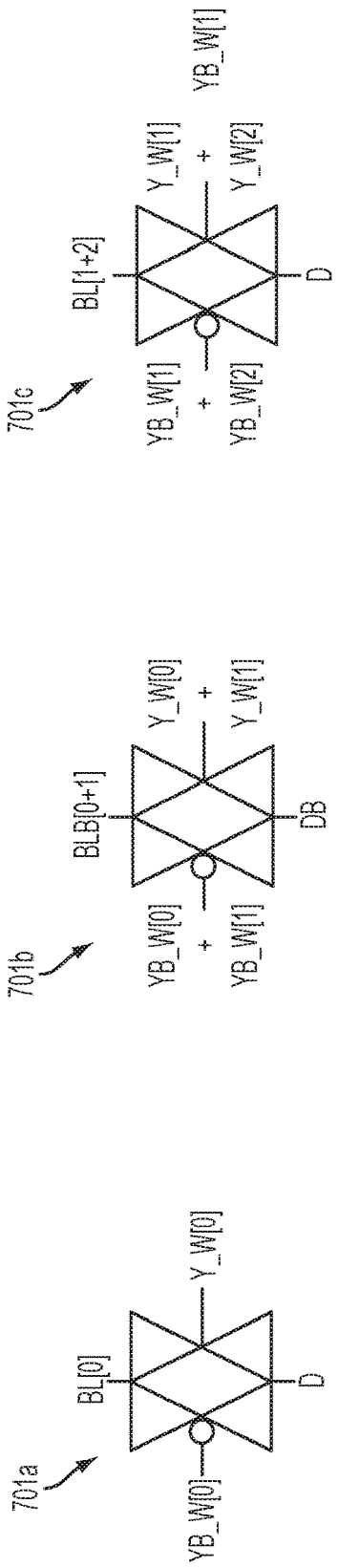
FIG. 7 is a diagram illustrating Write-Pass-Gates associated with a memory array having N=2 memory columns, which has a shared Write-Pass-Gate, in accordance with one or more example embodiments.

FIG. 7 is a diagram illustrating Write-Pass-Gates associated with a memory array as discussed above having N=2 memory columns, according to an example embodiment. For a memory array having N=2 memory columns 101, such as those discussed above, the number of write-pass-gates in such a circuit would be three, or in other words N+1. Compared to a two-dimensional memory array that includes 2*N write-pass-gates per LIO 111, the memory arrays discussed above make it possible to configure the memory array to include write-pass-gate 701*a*, write-pass-gate 701*b* and write-pass-gate 701*c* (hereinafter collectively referred to as write-pass-gate 701 where appropriate) for a memory array having 2=N memory columns 101. In some embodiments, however, any quantity of write-pass-gates 701 are included in the memory array.

Such a reduction in quantity of write-pass-gates 701 from that of a two-dimensional memory array reduces the complexity of, reduces power consumption by, and reduces space occupied by, a memory array while increasing processing speed potential of the memory array when compared to a two-dimensional memory array such as that discussed above.

Figure 8:
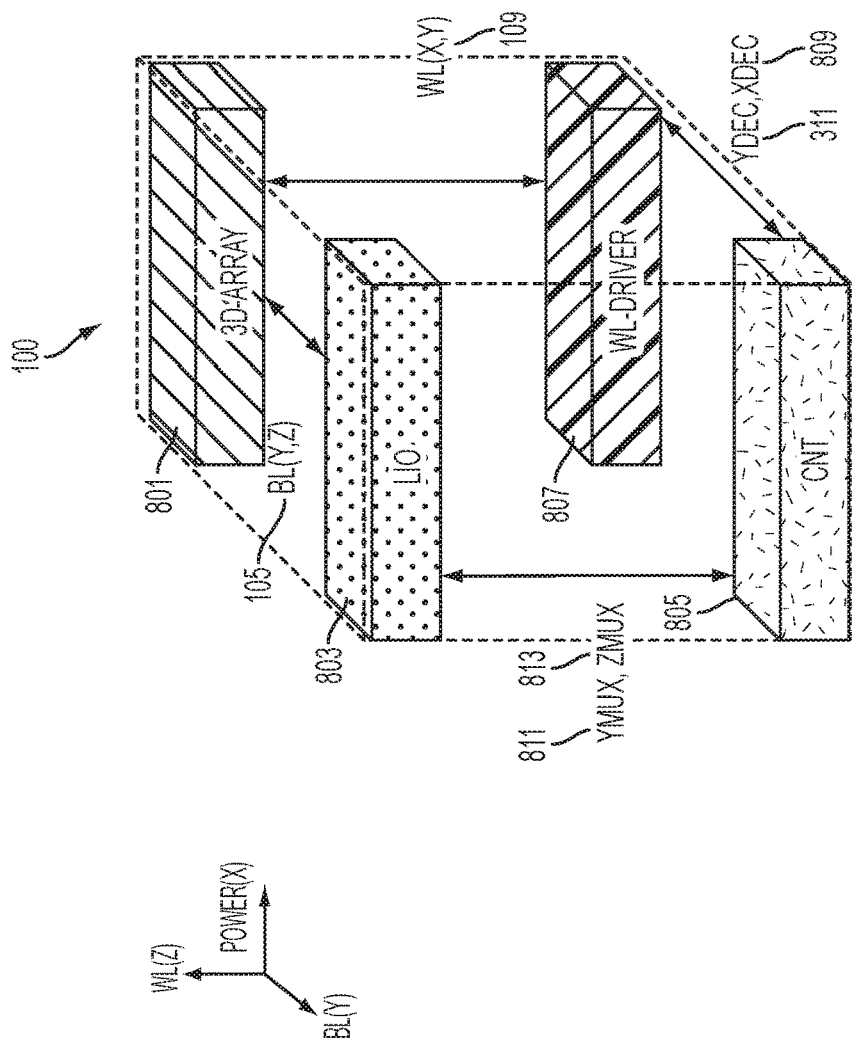
FIG. 8 is an isometric view of a memory array, in accordance with one or more example embodiments.

FIG. 8 is an isometric view of memory array such as memory array 100 discussed above, according to an example embodiment. The memory array 100 includes a 3D-array 801, a LIO 803, a controller 805 and a word line driver ("WL-driver") 807. In this example, the 3D-array 801 is in direct communication with the LIO 803 and the WL-driver 807. In other embodiments, the 3D-array is in communication with the LIO 803 and/or the WL-driver 807 indirectly by way of an intermediary component of the memory array. The 3D-array 801 is in communication with the controller 805 by way of the LIO 803 and/or the WL-driver 807. In other embodiments, the 3D-array 801 is in direct communication with the controller 805. The LIO 803 and the WL-driver 807 are in direct communication with the controller 805. In other embodiments, like the 3D-array, the LIO 803 and/or the WL-driver 807 are in communication with the controller 805 indirectly by way of at least one intermediary component of the memory array.

The 3D-array 801 is configured to include one or more memory columns 101, discussed above. BL 105 is illustrated as running between the LIO 803 and the 3D-array 801. WL 109 is illustrated as running between the WL-driver 807 and the 3D-array 801 in a direction orthogonal to that of the BL 105. YDEC 311 and XDEC 809 are illustrated as running between the controller 805 and the WL-driver 807. YMUX 811 and ZMUX 813 are illustrated as running between the LIO 803 and the controller 805.

The LIO 803, in some embodiments, is a single LIO that is configured to facilitate communications to the 3D-array 801 as a whole. In other embodiments, the LIO 803 includes any number of LIO's 803 configured to be in communication with one or more of the memory columns 101 included in the 3D-array 101. For example, in other embodiments, LIO 803 includes a number of LIO's 803 equal to the number of memory columns 101 in the 3D array. In other embodiments, LIO 803 includes lesser number of LIO's than the number of memory columns included in 3D-array 803. In yet another embodiment, LIO 803 includes a greater number of LIO's than the number of memory columns 101 included in the 3D-array 801.

Figure 9:
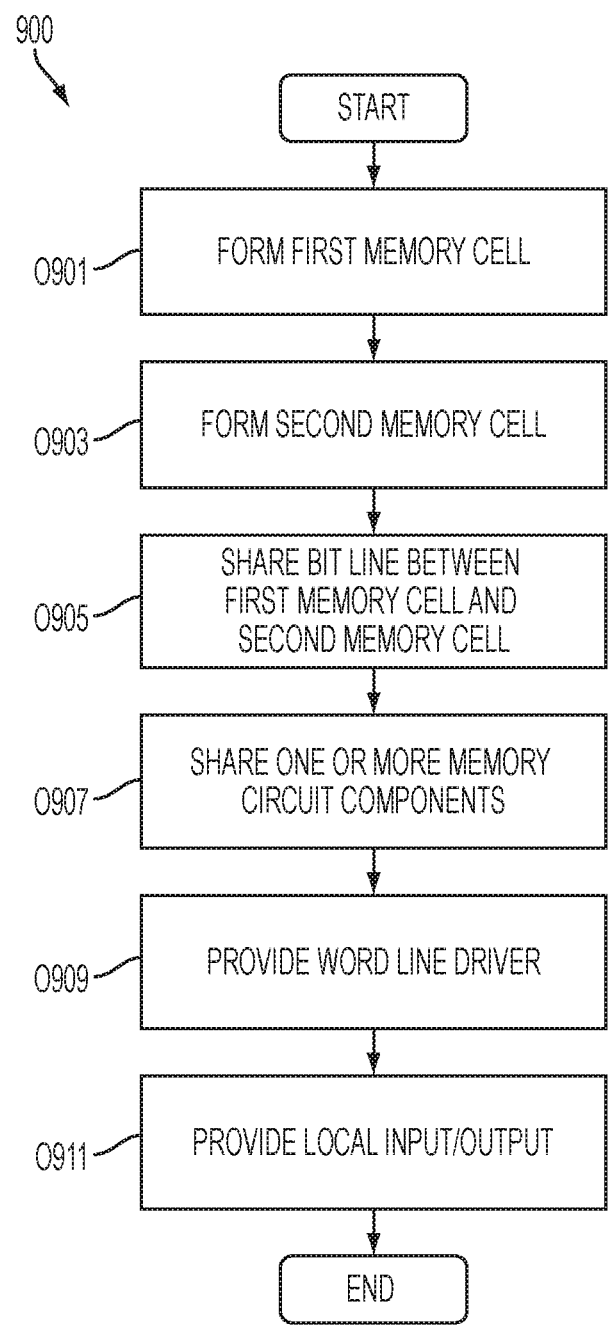
FIG. 9 is a flowchart of a process for forming a memory array, in accordance with one or more example embodiments.

FIG. 9 is a flowchart of a process 900 for forming a memory array according to one or more example embodiments. The process begins with operation O901 in which a first memory column is formed, the first memory column including a first bit line, a first word line, and a second bit line. In some embodiments, the first word line is substantially orthogonal to the first word line and the second word line.

Then, in operation O903, a second memory column is formed, the second memory column including the second bit line, a second word line, and a third bit line. In some embodiments, the second word line is substantially orthogonal to the second bit line and the third bit line. According to various embodiments, the first memory column and the second memory column are configured to be a three-dimensional array. In other embodiments, the first memory column, the second memory column and a third memory column are formed to have a column pitch between the first memory column and the third memory column that is equal to the width of the second memory column.

Next, in operation O905, the second bit line is shared between the first memory column and the second memory column.

The process continues to operation O907 in which one or more memory array components are shared between the first memory column and the second memory column. The memory array components comprise, for example, any of a bit line switch, a BL pre-charge node, or a YDEC, or other suitable component.

Then, in operation O909, a word line driver is provided such that the word line driver is in direct communication with the one or more of the first word line, the second word line, and a three-dimensional array that includes one or more of the first word line and the second word line.

Next, in operation O911, a local input/output is provided in direct communication with one or more of the first bit line, first word line, the second bit line, the second word line, and a three-dimensional array that includes one or more of the first bit line, the first word line, the second bit line and the second word line.

One aspect of this description relates to a memory array that includes a first column of memory cells, a second column of memory cells, a first pre-charge circuit, a second pre-charge circuit and a set of input output circuits. The first column of memory cells includes a first bit line, a first word line and a first bit line bar. The second column of memory cells includes the first bit line bar, a second word line and a second bit line. The first pre-charge circuit is coupled to the first bit line. The second pre-charge circuit is coupled to the first bit line bar. The first column of memory cells and the second column of memory cells are configured to share the first bit line bar. The first bit line and the first bit line bar are in a first plane. At least a portion of the first word line and at least a portion of the second word line are in a second plane intersecting the first plane.

Another aspect of this description relates to a memory array that includes a three-dimensional array including a first set of memory cells arranged in a first column and a second set of memory cells arranged in a second column. The first column includes a first bit line, a first bit line bar and a first word line. The second column includes the first bit line bar, a second bit line and a second word line. The memory array further includes a first pre-charge circuit coupled to the first bit line, a second pre-charge circuit coupled to the first bit line bar and a set of switching elements. The first column and the second column are configured to share the first bit line bar. At least two of the first bit line, the first bit line bar or the second bit line are in a first plane. The first word line and the second word line are in a second plane, the second plane intersecting the first plane.

Still another aspect of this description relates to a method for forming a memory array, the method including forming a first column of memory cells and forming a second column of memory cells. The first column of memory cells includes a first bit line, a first word line and a first bit line bar. The first bit line and the first bit line bar are in a first plane. The second column of memory cells includes the first bit line bar, a second word line and a second bit line. The first word line and the second word line are in a second plane intersecting the first plane. The first column of memory cells and the second column of memory cells being a three-dimensional array. The method further includes sharing the first bit line bar between the first column of memory cells and the second column of memory cells, sharing a first pre-charge circuit between the first column of memory cells and the second column of memory cells and providing a word line driver to the first word line and the second word line. The first pre-charge circuit is coupled to at least the first bit line bar. The word line driver is below the three-dimensional array.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A memory array comprising:
   a first column of memory cells comprising:
      a first bit line;
      a first word line; and
      a first bit line bar;
   a first pre-charge circuit coupled to the first bit line;
   a second pre-charge circuit coupled to the first bit line bar;
   a second column of memory cells comprising:
      the first bit line bar;
      a second word line; and
      a second bit line; and
   a set of input output circuits;
   wherein the first column of memory cells and the second column of memory cells are configured to share the first bit line bar;
   the first bit line and the first bit line bar are in a first plane; and
   at least a portion of the first word line and at least a portion of the second word line are in a second plane intersecting the first plane.

2. The memory array of claim 1, wherein the first pre-charge circuit comprises:
   a first transistor of a first type comprising:
      a first terminal of the first transistor;
      a second terminal of the first transistor being coupled to the first bit line; and
      a third terminal of the first transistor being coupled to at least a first supply voltage; and
   the second pre-charge circuit comprises:
   a second transistor of the first type comprising:
      a first terminal of the second transistor being coupled to at least the first terminal of the first transistor;
      a second terminal of the second transistor being coupled to the first bit line bar; and
      a third terminal of the second transistor being coupled to the first supply voltage and the third terminal of the first transistor.

3. The memory array of claim 2, wherein the second pre-charge circuit further comprises:
   a third transistor of the first type comprising:
      a first terminal of the third transistor being coupled to the first terminal of the first transistor and the first terminal of the second transistor;
      a second terminal of the third transistor being coupled to the second bit line; and a third terminal of the third transistor being coupled to the first supply voltage, the third terminal of the first transistor and the third terminal of the second transistor.

4. The memory array of claim 3, wherein the first type is a P-type.

5. The memory array of claim 1, further comprising:
a third column of memory cells comprising:
the second bit line;
a third word line; and
a second bit line bar; and
a fourth column of memory cells comprising:
the second bit line bar;
a fourth word line; and
a third bit line,
wherein the third column of memory cells and the second column of memory cells are configured to share the second bit line; and
the third column of memory cells and the fourth column of memory cells are configured to share the second bit line bar.

6. The memory array of claim 5, wherein
the second bit line bar and the third bit line are in the first plane; and
at least a portion of the third word line and at least a portion of the fourth word line are in the second plane.

7. The memory array of claim 1, further comprising:
a pull-up circuit coupled to the first bit line and the first bit line bar, and configured to pull the first bit line or the first bit line bar towards a first supply voltage.

8. The memory array of claim 7, wherein the pull-up circuit comprises:
a first transistor of a first type comprising:
a first terminal of the first transistor being coupled to at least the first bit line bar;
a second terminal of the first transistor being coupled to at least the first bit line; and
a third terminal of the first transistor being coupled to the first supply voltage; and
a second transistor of the first type comprising:
a first terminal of the second transistor being coupled to the second terminal of the first transistor and the first bit line;
a second terminal of the second transistor being coupled to the first bit line bar and the first terminal of the first transistor; and
a third terminal of the second transistor being coupled to the first supply voltage.

9. The memory array of claim 1, wherein the second plane is substantially orthogonal to the first plane.

10. The memory array of claim 1, wherein the set of input output circuits comprises:
a first data line;
a second data line;
a first pass gate comprising:
a first terminal of the first pass gate being coupled to the first bit line;
a second terminal of the first pass gate being coupled to the first data line;
a third terminal of the first pass gate being configured to receive a first control signal; and
a fourth terminal of the first pass gate being configured to receive a second control signal, the second control signal being inverted from the first control signal; and
a second pass gate comprising:
a first terminal of the second pass gate being coupled to the first bit line bar;
a second terminal of the second pass gate being coupled to the second data line;
a third terminal of the second pass gate being configured to receive at least the first control signal or a third control signal; and
a fourth terminal of the second pass gate being configured to receive at least the second control signal or a fourth control signal, the fourth control signal being inverted from the third control signal.

11. A memory array comprising:
a three-dimensional array comprising:
a first set of memory cells arranged in a first column; and
a second set of memory cells arranged in a second column;
the first column comprising:
a first bit line;
a first bit line bar; and
a first word line;
the second column comprising:
the first bit line bar;
a second bit line; and
a second word line;
a first pre-charge circuit coupled to the first bit line;
a second pre-charge circuit coupled to the first bit line bar; and
a set of switching elements,
wherein the first column and the second column are configured to share the first bit line bar;
at least two of the first bit line, the first bit line bar or the second bit line are in a first plane; and
the first word line and the second word line are in a second plane, the second plane intersecting the first plane.

12. The memory array of claim 11, further comprising:
a set of data lines; and
a sense amplifier coupled to the set of switching elements by the set of data lines.

13. The memory array of claim 12, wherein the set of switching elements comprises:
a first switching element having a first terminal coupled to the first bit line;
a second switching element having a first terminal coupled to the first bit line;
a third switching element having a first terminal coupled to the first bit line bar; and
a fourth switching element having a first terminal coupled to the second bit line.

14. The memory array of claim 13, wherein the set of data lines comprises:
a first data line coupled between a first terminal of the sense amplifier and a second terminal of the second switching element;
a second data line coupled between a second terminal of the sense amplifier and a second terminal of the third switching element; and
a third data line coupled between the first terminal of the sense amplifier and a second terminal of the fourth switching element.

15. The memory array of claim 11, wherein the first pre-charge circuit comprises:
a first p-type transistor comprising:
a first terminal of the first p-type transistor;
a second terminal of the first p-type transistor being coupled to the first bit line; and a third terminal of the first p-type transistor being coupled to a first supply voltage; and the second pre-charge circuit comprises:

a second p-type transistor comprising:

a first terminal of the second p-type transistor being coupled to at least the first terminal of the first p-type transistor;

a second terminal of the second p-type transistor being coupled to the first bit line bar; and a third terminal of the second p-type transistor being coupled to the first supply voltage.

16. The memory array of claim 15, wherein the second pre-charge circuit further comprises:

a third p-type transistor comprising:

a first terminal of the third p-type transistor being coupled to the first terminal of the first p-type transistor and the first terminal of the second p-type transistor;

a second terminal of the third p-type transistor being coupled to the second bit line; and a third terminal of the third p-type transistor being coupled to the first supply voltage.

17. The memory array of claim 11, wherein the second plane is substantially orthogonal to the first plane.

18. A method comprising:

forming a first column of memory cells, the first column of memory cells comprising:

a first bit line;

a first word line; and a first bit line bar, the first bit line and the first bit line bar being in a first plane;

forming a second column of memory cells, the second column of memory cells comprising:

the first bit line bar;

a second word line, the first word line and the second word line being in a second plane intersecting the first plane, the first column of memory cells and the second column of memory cells being a three-dimensional array; and a second bit line;

sharing the first bit line bar between the first column of memory cells and the second column of memory cells;

sharing a first pre-charge circuit between the first column of memory cells and the second column of memory cells, the first pre-charge circuit being coupled to at least the first bit line bar; and providing a word line driver to the first word line and the second word line, the word line driver being below the three-dimensional array.

19. The method of claim 18, further comprising:

providing a local input output circuit to the first bit line, the first bit line bar or the second bit line.

20. The method of claim 19, wherein providing the local input output circuit to the first bit line, the first bit line bar or the second bit line comprises:

coupling a set of data lines to the first bit line, the first bit line bar or the second bit line by a set of bit line switching elements.

* * * * *